(12) United States Patent
Nakamura et al.

(10) Patent No.: US 9,085,493 B2
(45) Date of Patent: Jul. 21, 2015

(54) PROCESS FOR PRODUCTION OF SILICON-CARBIDE-COATED CARBON BASE MATERIAL, SILICON-CARBIDE-COATED CARBON BASE MATERIAL, SINTERED (SILICON CARBIDE)-CARBON COMPLEX, CERAMIC-COATED SINTERED (SILICON CARBIDE)-CARBON COMPLEX, AND PROCESS FOR PRODUCTION OF SINTERED (SILICON CARBIDE)-CARBON COMPLEX (75) Inventors: Masaharu Nakamura, Osaka (JP); Yoshinari Miyamoto, Osaka (JP); Tetsuro Tojo, Osaka (JP)

(73) Assignee: Toyo Tanso Co., Ltd., Osaka (JP)

( * ) Notice: Subject to any disclaimer, the term of this patent is extended or adjusted under 35 U.S.C. 154(b) by 150 days.

(21) Appl. No.: 13/392,593

(22) PCT Filed: Sep. 1, 2010

(86) PCT No.: PCT/JP2010/064871
§ 371 (c)(1), (2), (4) Date: Feb. 27, 2012

(87) PCT Pub. No.: WO2011/027756
PCT Pub. Date: Mar. 10, 2011

(65) Prior Publication Data
US 2012/0156479 A1    Jun. 21, 2012

(30) Foreign Application Priority Data

Sep. 4, 2009   (JP) ................................. 2009-205041

(51) Int. Cl.
*B32B 5/16*       (2006.01)
*C04B 35/575*    (2006.01)
(Continued)

(52) U.S. Cl.
CPC ............... *C04B 41/009* (2013.01); *B82Y 30/00* (2013.01); *C01B 31/36* (2013.01); *C04B 35/522* (2013.01);
(Continued)

(58) Field of Classification Search
CPC .... C04B 35/645; C04B 35/52; C04B 35/565; C04B 35/575
USPC .................................... 427/215; 264/673, 682
See application file for complete search history.

(56) References Cited

U.S. PATENT DOCUMENTS 4,424,193 A    1/1984   Koyama et al.
5,656,563 A *  8/1997   Chen et al. ...................... 501/90
(Continued)

FOREIGN PATENT DOCUMENTS

JP    54-090216 A    7/1979
JP    59-129142 A    7/1984
(Continued)

OTHER PUBLICATIONS

Translation of JP 2001-180919 (2001).*
(Continued)

*Primary Examiner* — Holly Le
(74) *Attorney, Agent, or Firm* — Keating & Bennett, LLP (57) ABSTRACT

Produced is a silicon carbide-coated carbon base material in which a silicon carbide coating is densely and uniformly formed on the surface of a carbon base material, such as graphite. A production process includes the steps of: preparing a carbon base material the surface of which has basal plane sites of an $SP^2$ carbon structure with no dangling bond and edge plane sites of an $SP^2$ carbon structure with a dangling bond; and reacting the surface of the carbon base material with SiO gas in an atmosphere at a temperature of 1400° C. to 1600° C. and a pressure of 1 to 150 Pa to form silicon carbide, whereby the carbon base material coated with silicon carbide is produced.

8 Claims, 11 Drawing Sheets

(51) Int. Cl.

| | |
|---|---|
| *C04B 35/645* | (2006.01) |
| *C04B 41/00* | (2006.01) |
| *B82Y 30/00* | (2011.01) |
| *C04B 35/52* | (2006.01) |
| *C04B 35/626* | (2006.01) |
| *C04B 35/628* | (2006.01) |
| *C04B 41/50* | (2006.01) |
| *C04B 41/87* | (2006.01) |
| *C23C 14/06* | (2006.01) |
| *C01B 31/36* | (2006.01) |
| *C04B 111/00* | (2006.01) |

(52) U.S. Cl.
CPC ......... *C04B 35/575* (2013.01); *C04B 35/62675* (2013.01); *C04B 35/62834* (2013.01); *C04B 35/62884* (2013.01); *C04B 35/62897* (2013.01); *C04B 35/645* (2013.01); *C04B 41/5025* (2013.01); *C04B 41/87* (2013.01); *C23C 14/0635* (2013.01); *C04B 2111/00405* (2013.01); *C04B 2235/425* (2013.01); *C04B 2235/5436* (2013.01); *C04B 2235/666* (2013.01); *C04B 2235/72* (2013.01); *C04B 2235/77* (2013.01); *C04B 2235/781* (2013.01); *C04B 2235/96* (2013.01); *Y10T 428/265* (2015.01); *Y10T 428/2991* (2015.01)

(56) References Cited

U.S. PATENT DOCUMENTS

| | | | | |
|---|---|---|---|---|
| 5,707,567 | A * | 1/1998 | Pfaff | 264/29.7 |
| 5,968,653 | A * | 10/1999 | Coppella et al. | 428/408 |
| 6,001,756 | A * | 12/1999 | Takahashi et al. | 501/90 |
| 7,128,963 | B2 * | 10/2006 | Benitsch | 428/212 |
| 7,534,388 | B2 * | 5/2009 | Pujari et al. | 264/661 |
| 2004/0197542 | A1 * | 10/2004 | Benitsch | 428/304.4 |
| 2005/0156341 | A1 * | 7/2005 | Pujari et al. | 264/13 |
| 2006/0147790 | A1 | 7/2006 | Zaghib et al. | |
| 2009/0149309 | A1 * | 6/2009 | Akasaka et al. | 501/90 |

FOREIGN PATENT DOCUMENTS

| | | |
|---|---|---|
| JP | 4-272237 A | 9/1992 |
| JP | 6-263568 A | 9/1994 |
| JP | 07-033561 A | 2/1995 |
| JP | 7-133173 A | 5/1995 |
| JP | 7-267764 A | 10/1995 |
| JP | 9-52777 A | 2/1997 |
| JP | 2001-180919 A | 7/2001 |
| JP | 2001-198834 A | 7/2001 |
| JP | 2002-338847 A | 11/2002 |
| JP | 2004-339048 A | 12/2004 |
| JP | 2005-75720 A | 3/2005 |
| JP | 2009-91195 A | 4/2009 |
| RU | 2 165 999 C2 | 4/2001 |

OTHER PUBLICATIONS

Official Communication issued in corresponding European Patent Application No. 10813705.0, mailed on Apr. 25, 2013.
Morisada et al., "Oxidation Resistance of Multiwalled Carbon Nanotubes Coated with Silicon Carbide," J. Am. Ceram. Soc., vol. 87, No. 5, May 1, 2004, pp. 804-808.
English translation of Official Communication issued in corresponding International Application PCT/JP2010/064871, mailed on Apr. 19, 2012.
Official Communication issued in International Patent Application No. PCT/JP2010/064871, mailed on Nov. 2, 2010.
Official Communication issued in corresponding Japanese Patent Application No. 2009-205041, mailed on Sep. 24, 2013.
Official Communication issued in corresponding Rusian Patent Application No. 2012112935, mailed on Mar. 18, 2014.

* cited by examiner

PROCESS FOR PRODUCTION OF SILICON-CARBIDE-COATED CARBON BASE MATERIAL, SILICON-CARBIDE-COATED CARBON BASE MATERIAL, SINTERED (SILICON CARBIDE)-CARBON COMPLEX, CERAMIC-COATED SINTERED (SILICON CARBIDE)-CARBON COMPLEX, AND PROCESS FOR PRODUCTION OF SINTERED (SILICON CARBIDE)-CARBON COMPLEX

TECHNICAL FIELD

This invention relates to a process for production of a silicon carbide-coated carbon base material in which the surface of a carbon base material, such as graphite, is coated with silicon carbide, a silicon carbide-coated carbon base material, a sintered silicon carbide/carbon complex, and a ceramic-coated sintered silicon carbide/carbon complex.

BACKGROUND ART

Carbon materials have low specific gravity and excellent heat resistance, corrosion resistance, slidability, electric conductivity, heat conductivity, and workability, and are therefore conventionally used in a wide variety of fields including semiconductor technology, metallurgy, mechanical technology, electrotechnology, and nuclear technology.

However, carbon materials generally have a problem in that they are poor in oxidation resistance and strength. To solve this problem, it has been considered to combine a carbon material with another material, such as ceramics, to produce a complex.

Patent Literatures 1 to 3 disclose methods for improving the oxidation resistance of a carbon-based material by forming a silicon carbide coating on the surface of the carbon-based material.

Examples of processes of forming a silicon carbide coating which are used in the above disclosures include a chemical vapor deposition process (hereinafter, referred to as a CVD process) for depositing silicon carbide generated by vapor phase reaction and a conversion process (hereinafter, referred to as a CVR process) for forming silicon carbide by reacting carbon with a silicon component using carbon in a base material as a reaction source.

Furthermore, there is proposed, as a complex material composed of silicon carbide and a carbon material, a sintered silicon carbide/carbon complex in which silicon carbide fine powder and graphite particles are mixed and the mixture is sintered with high density by spark plasma sintering (see Patent Literature 4).

A conceivable alternative process for producing such a sintered silicon carbide/carbon complex is the process of sintering graphite particles each coated with a silicon carbide coating.

Patent Literature 5 proposes to coat the surfaces of carbon nanotubes with silicon carbide through a CVD process or a CVR process. Patent Literature 6 proposes to coat the surface of diamond with a silicon carbide coating through a CVD process or a CVR process.

However, upon coating of the surface of a carbon base material, such as graphite, with a silicon carbide coating through the CVD process or the CVR process, there arises a problem in that the surface cannot be uniformly coated.

CITATION LIST

Patent Literature

Patent Literature 1: JP-A-H07-133173
Patent Literature 2: JP-A-H09-52777
Patent Literature 3: JP-A-H06-263568
Patent Literature 4: JP-A-2004-339048
Patent Literature 5: JP-A-2005-75720
Patent Literature 6: JP-A-2001-198834

SUMMARY OF INVENTION

Technical Problem

An object of the present invention is to provide a process for production of a silicon carbide-coated carbon base material which can densely and uniformly coat the surface of a carbon base material, such as graphite, with a silicon carbide coating, a silicon carbide-coated carbon base material which can be produced by the above production process, and a sintered silicon carbide/carbon complex which can be produced using the above silicon carbide-coated carbon base material.

Solution to Problem

A process for production of a silicon carbide-coated carbon base material according to the present invention includes the steps of: preparing a carbon base material the surface of which has basal plane sites of an $SP^2$ carbon structure with no dangling bond and edge plane sites of an $SP^2$ carbon structure with a dangling bond; and reacting the surface of the carbon base material with SiO gas in an atmosphere at a temperature of 1400° C. to 1600° C. and a pressure of 1 to 150 Pa to form silicon carbide, whereby the carbon base material coated with silicon carbide is produced.

The surface of the carbon base material in the present invention has basal plane sites of an $SP^2$ carbon structure with no dangling bond and edge plane sites of an $SP^2$ carbon structure with a dangling bond. The inventors have studied why upon formation of a silicon carbide coating on the surface of a carbon base material, such as graphite, through the CVD or CVR process, the silicon carbide coating cannot be uniformly formed. As a result, they have found that because the graphite surface has edge plane sites of an $SP^2$ carbon structure with a dangling bond and the edge plane sites have high reaction activity, a silicon carbide coating is formed preferentially at the edge plane sites having high reaction activity upon formation of silicon carbide through the CVD or CVR process, so that an uniform coating cannot be formed. The $SP^2$ carbon structure has three bonds. While at the basal plane sites all of the three bonds are involved in chemical bonding, at the edge plane sites one or two of the three bonds are dangling. For this reason, the edge plane sites can be considered to have high reaction activity.

Particularly upon formation of a silicon carbide coating through the CVD process, the silicon carbide coating is likely to be formed preferentially at the edge plane sites, so that a uniform coating cannot be formed. In addition, upon formation of a silicon carbide coating through the CVD process, a porous coating including large deposited particles and having many voids is formed and a dense silicon carbide coating is difficult to uniformly form.

In the present invention, silicon carbide is formed by reacting the surface of the carbon base material with SiO gas in an atmosphere at a temperature of 1400° C. to 1600° C. and a pressure of 1 to 150 Pa. Therefore, the silicon carbide coating in the present invention is formed through a CVR process. When in accordance with the present invention a silicon carbide coating is formed through the CVR process in an atmosphere at a temperature of 1400° C. to 1600° C. and a pressure of 1 to 150 Pa, the silicon carbide coating can be densely and uniformly formed on the surface of the carbon base material having basal plane sites and edge plane sites.

If the temperature is below 1400° C., the reaction for forming silicon carbide will be less likely to progress, so that a silicon carbide coating will be less likely to be formed. On the other hand, if the temperature is above 1600° C., a silicon carbide coating through the CVD process will be likely to be formed, so that a dense and uniform coating will not be able to be formed.

Furthermore, if the pressure is below 1 Pa, the rate of formation of a silicon carbide coating through the CVR process will be decreased, which is unfavorable. On the other hand, if the pressure is above 150 Pa, a silicon carbide coating through the CVD process will be likely to be formed, so that a dense and uniform coating will not be able to be formed.

An example of the carbon base material in the present invention is a graphite base material. Graphite has an $SP^2$ carbon structure and therefore has basal plane sites and edge plane sites on its surface.

The carbon base material in the present invention may be in the form of a block or in the form of particles. Therefore, the carbon base material may be carbon particles. When the carbon base material is carbon particles, the preferred carbon particles for use are those having an average particle size within the range of 50 nm to 500 μm.

In the present invention, the SiO gas can be generated from a source of SiO placed together with the carbon base material. An example of such a source of SiO is SiO particles. In this case, the carbon base material and the source of SiO are placed in, for example, a crucible serving as a reaction container and the crucible is placed in a baking furnace. Thus, the interior of the crucible can be heated and evacuated.

A silicon carbide-coated carbon base material according to the present invention is a carbon base material surface-coated with a layer of silicon carbide by reacting the surface of the carbon base material having basal plane sites of an $SP^2$ carbon structure with no dangling bond and edge plane sites of an $SP^2$ carbon structure with a dangling bond with a silicon component to form silicon carbide, wherein the thickness of the layer of silicon carbide is 20 μm or less.

In the silicon carbide-coated carbon base material according to the present invention, the thickness of the layer of silicon carbide is 20 μm or less. Even if the thickness of the layer of silicon carbide is 20 μm or less, silicon carbide is uniformly and densely formed. Such a silicon carbide-coated carbon base material according to the present invention can be produced by the above production process according to the present invention.

The thickness of the layer of silicon carbide is more preferably within the range of 1 nm to 20 μm and still more preferably within the range of 5 nm to 20 μm.

An example of the carbon base material in the silicon carbide-coated carbon base material according to the present invention is a graphite base material. Furthermore, the carbon base material may be carbon particles like the above. In this case, the average particle size of the carbon particles is preferably within the range of 50 nm to 500 μm.

When the carbon base material is carbon particles, the silicon carbide-coated carbon base material according to the present invention preferably has a weight reduction upon heating in air at 650° C. for an hour of below 5% by weight. Since the layer of silicon carbide is densely and uniformly formed on the particle surface, the weight reduction under the above conditions can be reduced to below 5% by weight.

A sintered silicon carbide/carbon complex according to the present invention is a sintered silicon carbide/carbon complex obtained by sintering carbon base material particles coated with silicon carbide, wherein the relative density of the sintered silicon carbide/carbon complex is 90% to 100% and the total content of Al, Be, B, and Se therein is below 0.1% by weight.

The sintered silicon carbide/carbon complex according to the present invention can be obtained by sintering the above silicon carbide-coated carbon base material according to the present invention. Since the above silicon carbide-coated carbon base material according to the present invention has a dense silicon carbide coating uniformly formed on the surface thereof, the sintering can be performed at a low temperature of 2200° C. or below without the use of any sintering aid. Therefore, the relative density can be 90% to 100%. Furthermore, the total content of Al, Be, B, and Se which are components of a sintering aid can be below 0.1% by weight.

An example of the carbon base material particles used in the sintered silicon carbide/carbon complex according to the present invention is graphite particles. Furthermore, the average particle size of the carbon base material particles is preferably within the range of 50 nm to 500 μm.

Furthermore, the thickness of the layer of silicon carbide on the surface of the carbon base material particle is preferably within the range of 1 nm to 20 μm, more preferably within the range of 200 nm to 10 μm, and still more preferably within the range of 500 nm to 5 μm.

In a ceramic-coated sintered silicon carbide/carbon complex according to the present invention, a ceramic coating layer is formed on at least a portion of the surface of the sintered silicon carbide/carbon complex.

A process for production of a sintered silicon carbide/carbon complex according to the present invention is a process for production of the above sintered silicon carbide/carbon complex according to the present invention, wherein the sintering is performed at a temperature of 2200° C. or below.

As described above, since the silicon carbide-coated carbon base material according to the present invention has a dense silicon carbide coating uniformly formed on the surface thereof, the sintering can be performed even at a low temperature of 2200° C. or below. Examples of the sintering temperature are generally 1600° C. to 2200° C.

In the process for production of a sintered silicon carbide/carbon complex according to the present invention, the sintering can be performed at a temperature of 2200° C. or below without the use of any sintering aid. Since the sintering can be performed without the use of any sintering aid, a dense sintered silicon carbide/carbon complex can be produced which has a high purity and a low total content of Al, Be, B, and Se.

Advantageous Effects of Invention

In the process for production of a silicon carbide-coated carbon base material according to the present invention, a silicon carbide coating can be densely and uniformly formed on the surface of the carbon base material, such as graphite.

In the silicon carbide-coated carbon base material according to the present invention, the thickness of the layer of silicon carbide is 20 μm or less. Therefore, a dense sintered silicon carbide/carbon complex of high relative density can be produced.

The relative density of the sintered silicon carbide/carbon complex according to the present invention is 90% to 100% and the total content of Al, Be, B, and Se therein is below 0.1% by weight. Therefore, a dense sintered silicon carbide/carbon complex containing less impurities can be obtained.

Since in the ceramic-coated sintered silicon carbide/carbon complex according to the present invention, a ceramic coating layer is formed on at least a portion of the surface of a sintered silicon carbide/carbon complex, the ceramic coating layer and silicon carbide contained in the sintered silicon carbide/carbon complex can be easily sintered to achieve a ceramic coating layer having extremely high adhesion.

In the process for production of a sintered silicon carbide/carbon complex according to the present invention, the above sintered silicon carbide/carbon complex according to the present invention can be efficiently produced.

DESCRIPTION OF EMBODIMENTS

Hereinafter, the present invention will be described with reference to specific examples; however, the present invention is not limited by the following examples.

[Silicon Carbide Coating Treatment]

Figure 1:
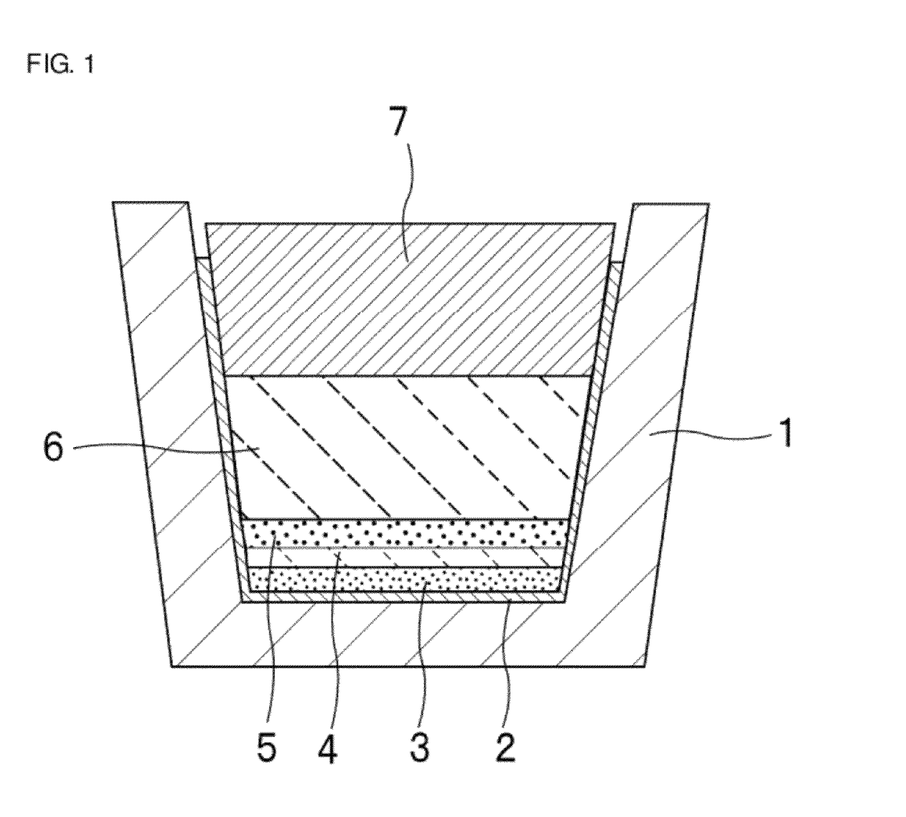
FIG. 1 is a schematic cross-sectional view showing a placement of elements in a crucible in an example according to the present invention.

FIG. 1 is a schematic cross-sectional view showing a placement of elements in a crucible used in a silicon carbide coating treatment. As shown in FIG. 1, a carbon sheet 2 was placed in a graphite crucible 1 and SiO powder 3 was placed as a source of SiO on the carbon sheet 2. A layer of carbon felt 4 was placed on the SiO powder 3 and graphite particles 5 were placed as a carbon base material on the layer of carbon felt 4. A layer of carbon felt 6 was placed on the graphite particles 5 and a carbon sheet 7 was placed on the layer of carbon felt 6.

Although this example employs the graphite crucible 1, an alumina crucible may be employed.

The graphite crucible 1 placed as shown in FIG. 1 was placed in a baking furnace and the baking furnace was evacuated and heated, so that the interior of the graphite crucible 1 was heated to a predetermined temperature and evaluated to a predetermined pressure.

It can be assumed that by evacuating the interior of the graphite crucible 1 to the predetermined pressure and heating it to the predetermined temperature, SiO gas is generated from the SiO powder, and the SiO gas reacts with the surfaces of the graphite particles in the following manner so that the surfaces of the graphite particles are converted into silicon carbide, whereby silicon carbide coatings were formed on the surfaces of the graphite particles by a CVR process.

$$SiO(g)+C(s) \rightarrow SiC(s)+CO(g) \tag{1}$$

$$SiO(g)+3CO(g) \rightarrow SiC(s)+2CO_2(g) \tag{2}$$

$$CO_2(g)+C(s) \rightarrow 2CO(g) \tag{3}$$

Comparison between CVR and CVD Processes

Example 1

Formation of Silicon Carbide Coating through CVR Process

The SiO powder used was SiO powder with an average particle size of 300 μm, and the graphite particles used were graphite particles with an average particle size of 20 μm. Using them, silicon carbide coatings were formed on the surfaces of the graphite particles in the placement state inside the crucible shown in Table 1 to produce silicon carbide-coated graphite particles. The heating temperature was 1500° C. and the heating time was two hours. The pressure was controlled to 20 Pa.

Figure 4:
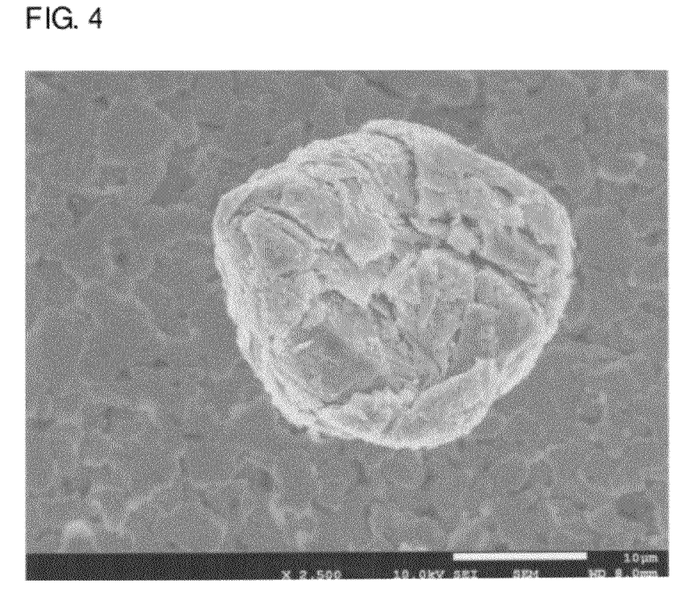
FIG. 4 is a scanning electron micrograph (2500 magnification) showing a silicon carbide-coated graphite particle in the example according to the present invention.
Figure 5:
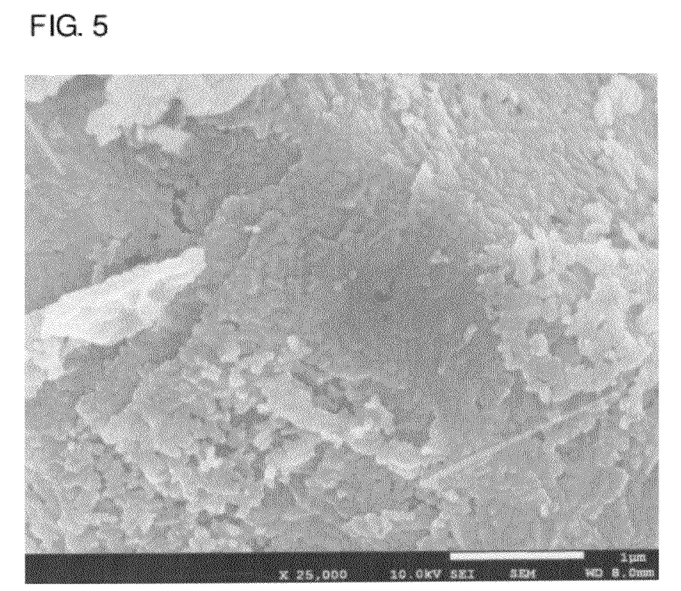
FIG. 5 is a scanning electron micrograph (25000 magnification) showing silicon carbide on the surface of the silicon carbide-coated graphite particle in the example according to the present invention.

FIG. 4 is a scanning electron micrograph showing a resultant silicon carbide-coated graphite particle. FIG. 5 is a scanning electron micrograph showing a silicon carbide coating on the surface of the resultant silicon carbide-coated graphite particle.

As shown in FIGS. 4 and 5, it can be seen that a dense silicon carbide coating is uniformly formed on the surface of the graphite particle.

The rate of SiC conversion is 55% by weight and the thickness of the silicon carbide (SiC) coating is 1 μm.

Figure 2:
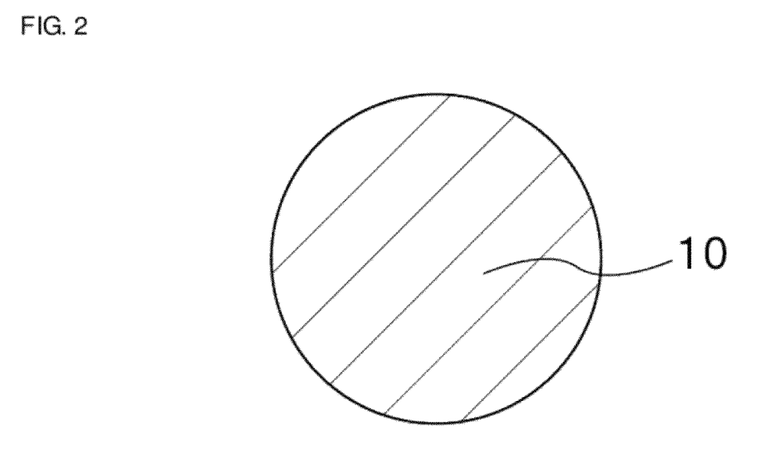
FIG. 2 is a cross-sectional view showing a carbon base material.
Figure 3:
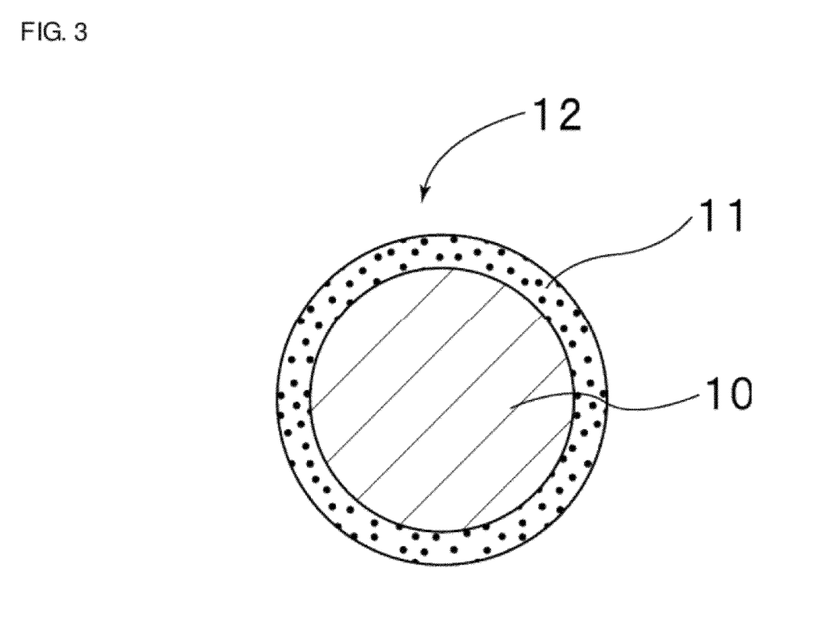
FIG. 3 is a cross-sectional view showing a silicon carbide-coated carbon base material.

FIGS. 2 and 3 are cross-sectional views for illustrating the formation of a silicon carbide coating through a CVR process. FIG. 2 shows a graphite particle 10. When SiO gas is brought into contact with the surface of the graphite particle 10 shown in FIG. 2, carbon on the surface of the graphite particle 10 and SiO gas react in the manner shown in the above Reaction Formulae (1) to (3), so that carbon on the surface is converted into silicon carbide.

FIG. 3 is a view showing the graphite particle on which a silicon carbide coating is formed through the CVR process. As shown in FIG. 3, through the reaction between carbon and SiO gas, a silicon carbide coating 11 is formed on the surface of the graphite particle 10, so that a silicon carbide-coated graphite particle 12 is formed.

Figure 8:
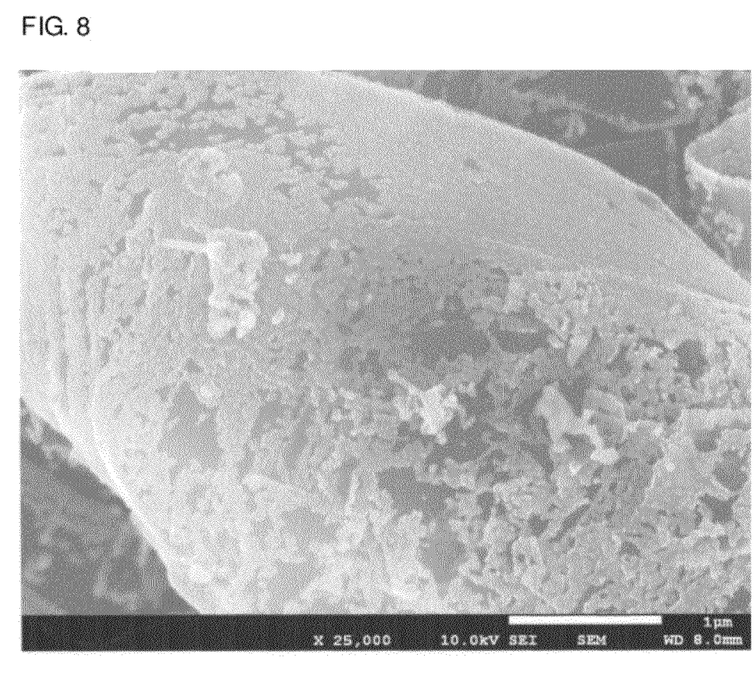
FIG. 8 is a scanning electron micrograph (25000 magnification) showing silicon carbide on the surface of the silicon carbide-coated graphite particle in the example according to the present invention.

FIG. 8 is a scanning electron micrograph (25000 magnification) showing an initial silicon carbide coating formed through the CVR process. As shown in FIG. 8, it can be seen that a silicon carbide coating is densely and uniformly formed.

Comparative Example 1

Formation of Silicon Carbide Coating through CVD Process

Silicon carbide-coated graphite particles were produced in the same manner as in Example 1 except that the temperature was at 1500° C. and the pressure was at 105 kPa.

Figure 6:
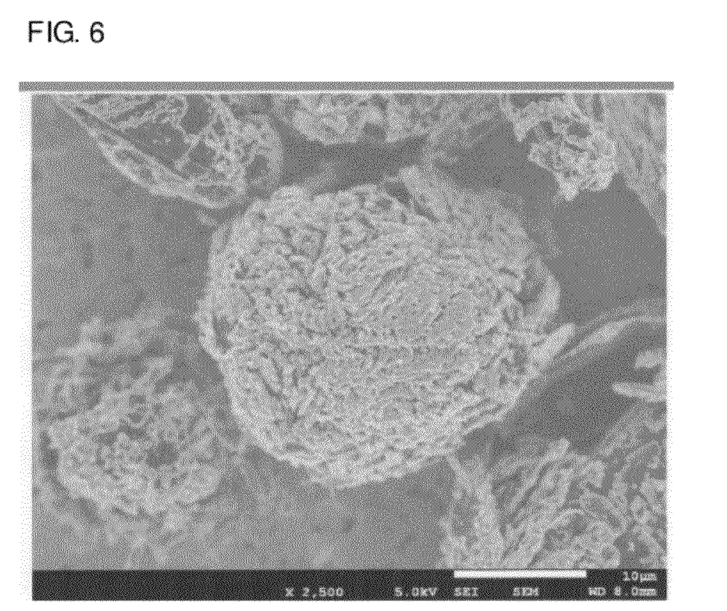
FIG. 6 is a scanning electron micrograph (2500 magnification) showing a silicon carbide-coated graphite particle in a comparative example.
Figure 7:
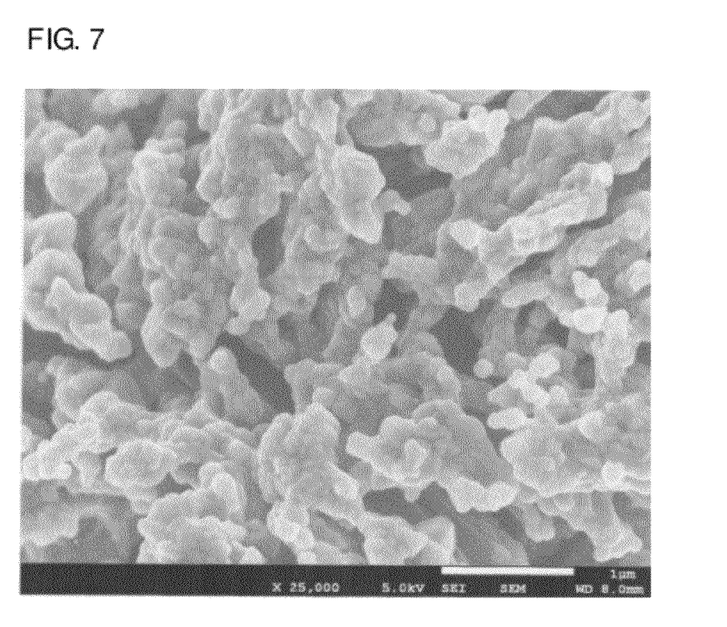
FIG. 7 is a scanning electron micrograph (25000 magnification) showing silicon carbide on the surface of the silicon carbide-coated graphite particle in the comparative example.

FIG. 6 is a scanning electron micrograph (2500 magnification) showing a resultant silicon carbide-coated graphite particle. FIG. 7 is a scanning electron micrograph (25000 magnification) showing the surface of the resultant silicon carbide-coated graphite particle.

The silicon carbide coating is formed by the CVD process, and as shown in FIGS. 6 and 7 it is formed of relatively large particles and has many voids.

The rate of SiC conversion is 60% by weight and the thickness of the silicon carbide (SiC) coating is 2 μm.

Figure 9:
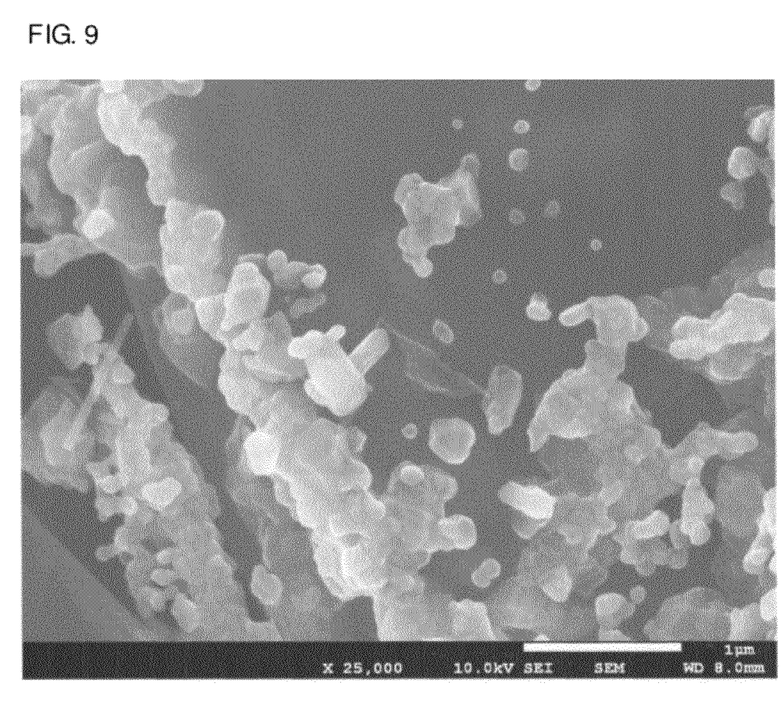
FIG. 9 is a scanning electron micrograph (25000 magnification) showing silicon carbide on the surface of the silicon carbide-coated graphite particle in the comparative example.

FIG. 9 is a scanning electron micrograph (25000 magnification) showing an initial silicon carbide coating formed through the CVD process. As shown in FIG. 9, it can be seen that silicon carbide is formed preferentially at edge plane sites of the graphite particle.

[Effects of Heating Temperature]

Effects of the heating temperature were examined by employing different heating temperatures of 1200° C., 1300° C., 1400° C., 1450° C., 1500° C., 1550° C., 1600° C., 1700° C., and 1800° C. The pressure was at 20 Pa. Silicon carbide coatings were formed on the surfaces of graphite particles, the other conditions being the same as in Example 1.

Resultant silicon carbide-coated graphite particles were observed with a scanning electron micrography (SEM) to evaluate the states of silicon carbide coatings on the surfaces of the graphite particles. The evaluation results are shown in Table 1.

TABLE 1

| Heating Temperature (° C.) | Property of Silicon Carbide Coating |
| --- | --- |
| 1200 | Coating not well formed |
| 1300 | Coating not well formed |
| 1400 | Coating densely and uniformly formed |
| 1450 | Coating densely and uniformly formed |
| 1500 | Coating densely and uniformly formed |
| 1550 | Coating densely and uniformly formed |
| 1600 | Coating densely and uniformly formed |
| 1700 | Porous and coarse coating formed |
| 1800 | Porous and coarse coating formed |

As is evident from the results shown in Table 1, when the heating temperature is within the range of 1400° C. to 1600° C., a silicon carbide coating can be densely and uniformly formed. When the heating temperature is below 1400° C., a coating is not well formed. Furthermore, when the heating temperature is above 1600° C., thin film formation through the CVD process becomes dominant, so that a porous and coarse coating is formed.

Figure 10:
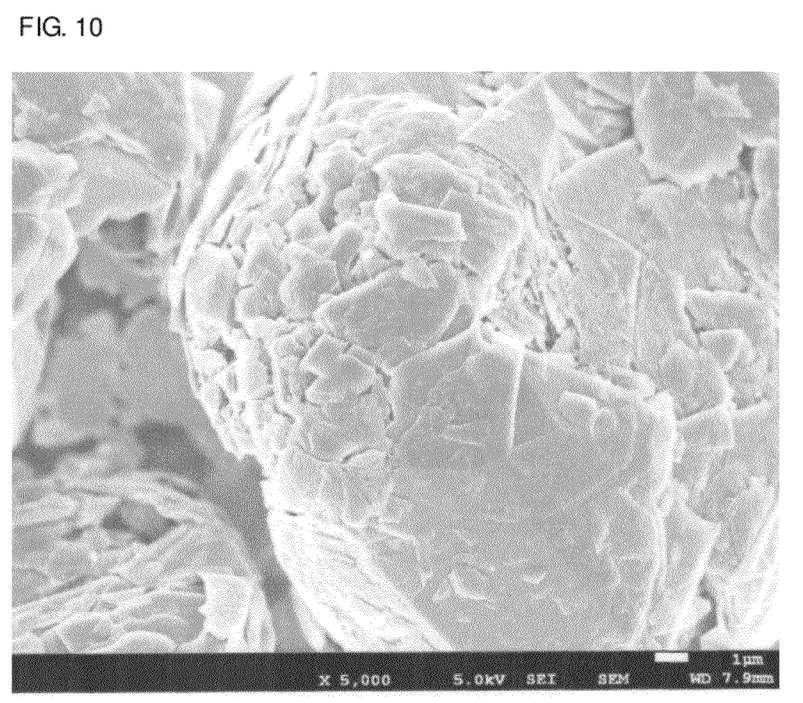
FIG. 10 is a scanning electron micrograph (5000 magnification) showing an uncoated graphite particle used in the example according to the present invention.

FIG. 10 is a scanning electron micrograph (5000 magnification) showing a graphite particle before the formation of a silicon carbide coating thereon.

Figure 11:
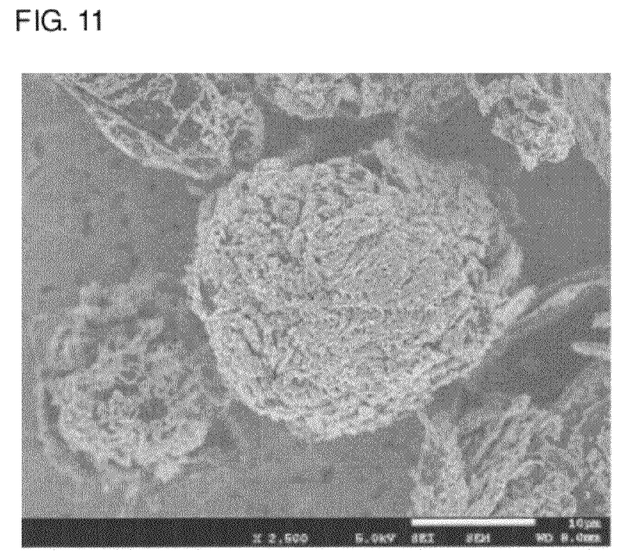
FIG. 11 is a scanning electron micrograph (2500 magnification) showing a silicon carbide-coated graphite particle in an example according to the present invention.

FIG. 11 is a scanning electron micrograph (2500 magnification) showing a silicon carbide-coated graphite particle in which a silicon carbide coating has been formed at a heating temperature of 1500° C.

Figure 12:
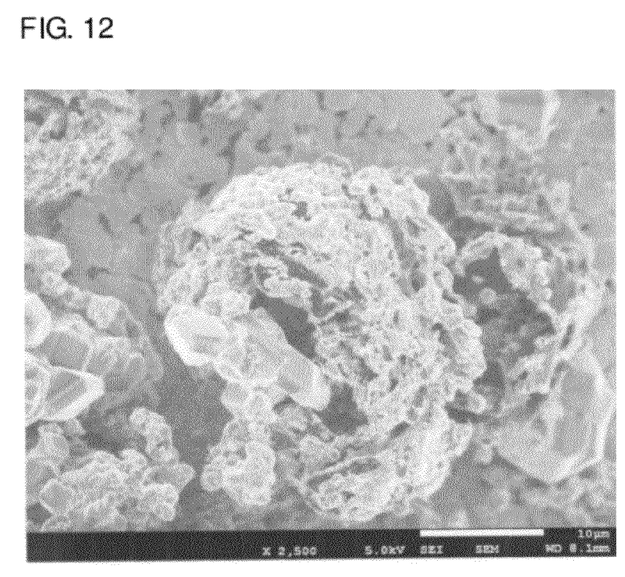
FIG. 12 is a scanning electron micrograph (2500 magnification) showing a silicon carbide-coated graphite particle in a comparative example.

FIG. 12 is a scanning electron micrograph (2500 magnification) showing a silicon carbide-coated graphite particle in which a silicon carbide coating has been formed at a heating temperature of 1800° C.

Figure 13:
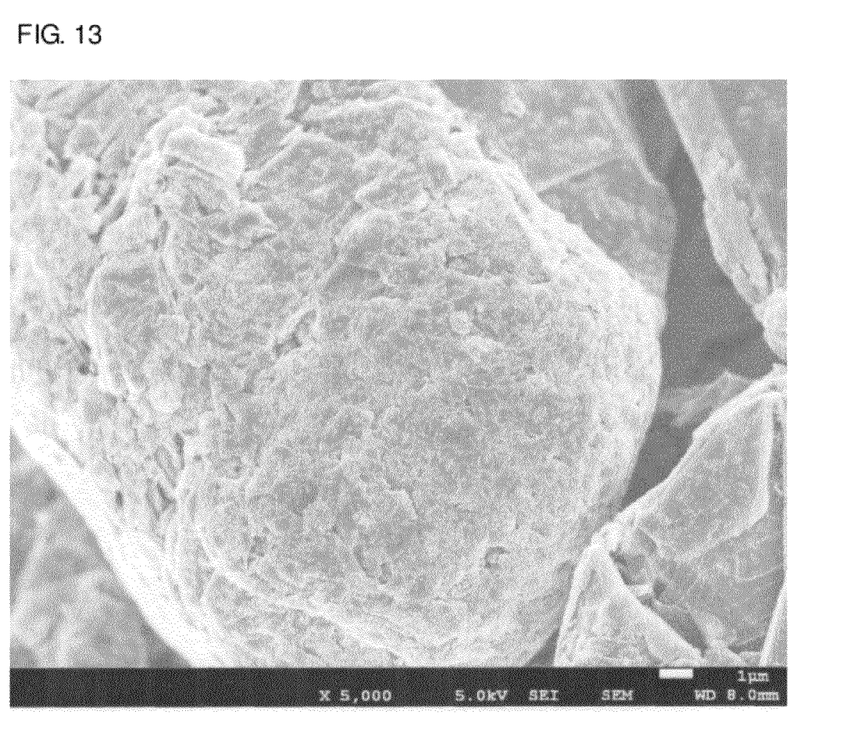
FIG. 13 is a scanning electron micrograph (5000 magnification) showing a silicon carbide-coated graphite particle in a comparative example.

FIG. 13 is a scanning electron micrograph (5000 magnification) showing a silicon carbide-coated graphite particle in which a silicon carbide coating has been formed at a heating temperature of 1200° C.

[Effects of Pressure]

Silicon carbide-coated graphite particles were produced by employing a common heating temperature of 1500° C. and different pressures of 20 Pa, 50 Pa, 100 Pa, 150 Pa, and 200 Pa. Table 2 shows evaluation results regarding properties of silicon carbide coatings on the surfaces of the produced silicon carbide graphite particles.

TABLE 2

| Pressure (Pa) | Property of Silicon Carbide Coating |
| --- | --- |
| 20 | Coating densely and uniformly formed |
| 50 | Coating densely and uniformly formed |
| 100 | Coating densely and uniformly formed |
| 150 | Coating densely and uniformly formed |
| 200 | Porous and coarse coating formed |

As shown in Table 2, when the pressure is 150 Pa or below, a silicon carbide coating can be densely and uniformly formed.

When the pressure is above 150 Pa, the formation of silicon carbide coatings through the CVD process becomes dominant, so that the silicon carbide coatings are formed as porous and coarse coatings.

[Measurement of Oxidation Onset Temperature]

Thermogravimetry (TG) was conducted on silicon carbide-coated graphite particles of Example 1, silicon carbide-coated graphite particles of Comparative Example 1, and graphite particles uncoated with silicon carbide.

Figure 14:
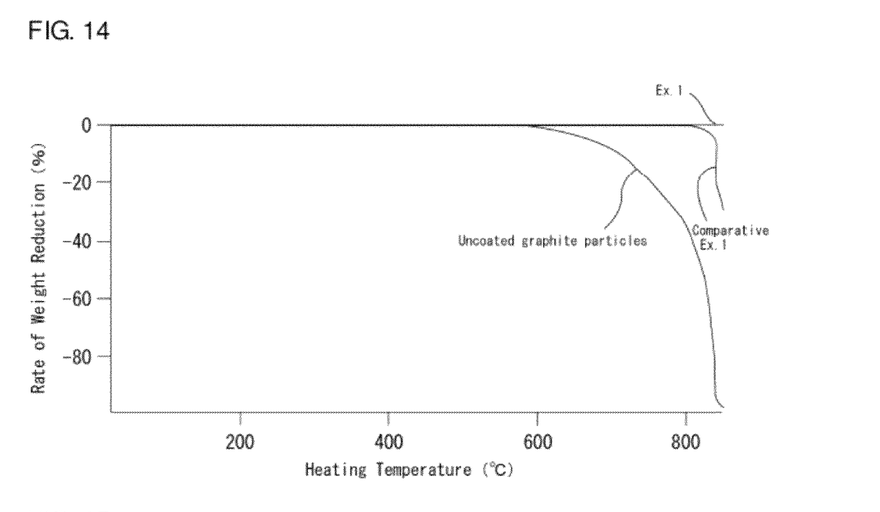
FIG. 14 is a graph showing the rate of weight reduction of the silicon carbide-coated graphite particles in the example according to the present invention plotted against heating temperature.

FIG. 14 is a graph plotted between heating temperature and rate of weight reduction. As shown in FIG. 14, the silicon carbide-coated graphite particles of Example 1 according to the present invention exhibited an oxidation onset temperature of 750° C. or above. On the other hand, the silicon carbide-coated graphite particles of Comparative Example 1 exhibited an oxidation onset temperature of 700° C. Furthermore, the oxidation onset temperature of the uncoated graphite particles was approximately 550° C.

It was confirmed that for the silicon carbide-coated graphite particles of Example 1, the rate of weight reduction upon heating in air at 650° C. for an hour was below 5% by weight.

[Production of Sintered Silicon Carbide/Carbon Complex]

A sintered silicon carbide/carbon complex was produced using the silicon carbide-coated graphite particles of Example 1. The sintered silicon carbide/carbon complex was produced by subjecting the silicon carbide-coated graphite particles to pressure sintering with a high-current discharge joining system ("SPS-1050" produced by Sumitomo Coal Mining Co., Ltd.). With the use of this system, the graphite particles were sintered by spark plasma sintering. Spark plasma sintering is a process for sintering powder not only by direct heating through the passage of electric current but also by generation of electric current impulse through the passage of pulsed electric current, whereby powder can be sintered at lower temperatures than normal.

In this case, the sintered complex was produced by heat application at 2000° C. for 20 minutes under a pressure of 40 MPa.

Figure 15:
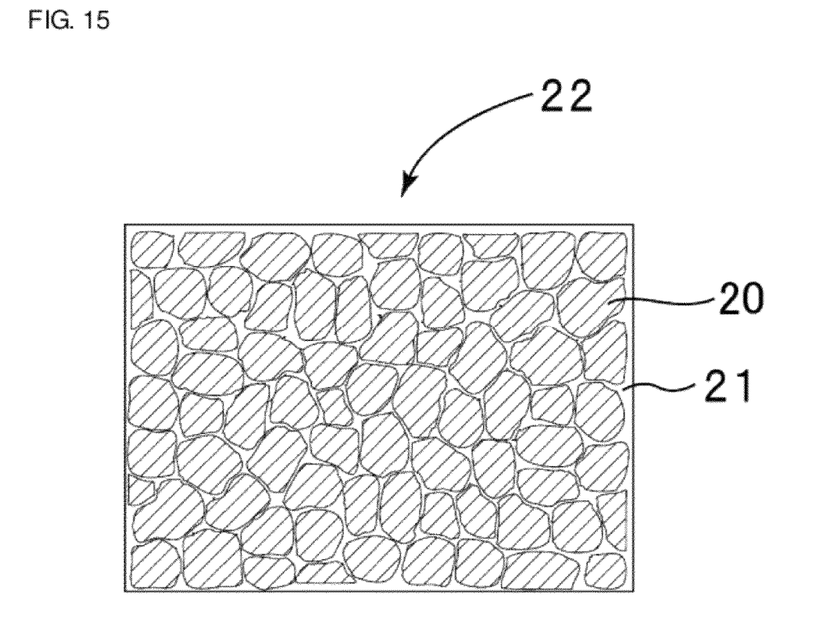
FIG. 15 is a schematic cross-sectional view showing a sintered silicon carbide/carbon complex according to the present invention.

FIG. 15 is a schematic cross-sectional view showing a sintered silicon carbide/carbon complex. As shown in FIG. 15, the sintered silicon carbide/carbon complex 22 has a silicon carbide interfacial layer 21 around graphite particles 20. The silicon carbide interfacial layer 21 is provided continuously in the form of a three-dimensional network in the sintered silicon carbide/carbon complex 22. Since the silicon carbide-coated graphite particles of the present invention have silicon carbide coatings formed densely and uniformly on the surfaces, the production of a sintered complex using the silicon carbide-coated graphite particles results in the formation of a continuous silicon carbide interfacial layer 21 with a uniform thickness around the graphite particles 20.

Furthermore, since dense and uniform silicon carbide coatings are formed on the surfaces of the graphite particles, a sintered complex can be produced at a low temperature of 2200° C. or below without the use of any sintering aid.

The bending strength of the resultant sintered complex was 150 MPa and the bulk density thereof was 2.52 g/cm³. Since the rate of SiC conversion of the silicon carbide-coated graphite particles of Example 1 is 55% by weight, the theoretical density of the sintered complex is 2.62 g/cm³ and the relative density thereof is 96%.

Furthermore, since no sintering aid is used, the total content of Al, Be, B, and Sa is below 0.1% by weight.

When the resultant sintered complex was measured in term of varistor characteristic, an I-V characteristic graph typical for varistor characteristic was obtained.

[Production of Ceramic-Coated Sintered Silicon Carbide/Carbon Complex]

Figure 16:
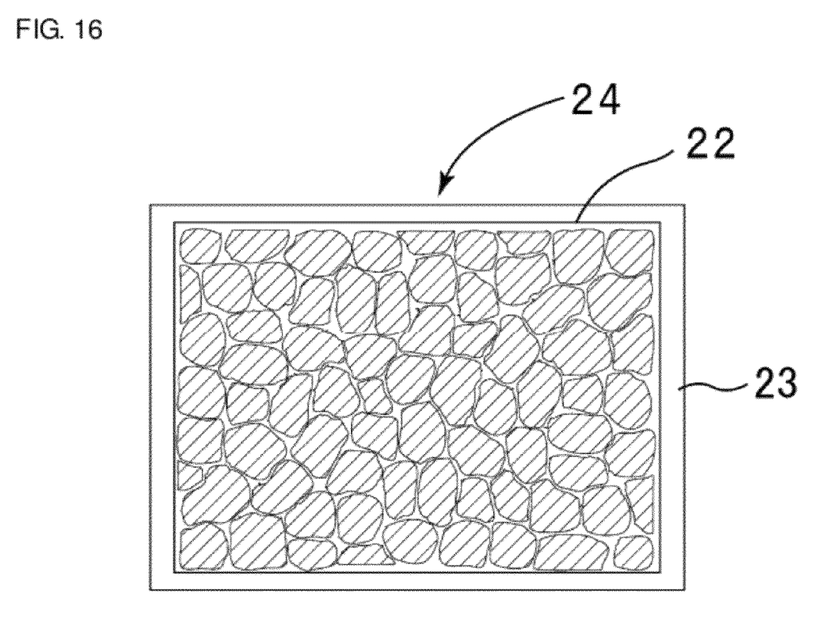
FIG. 16 is a schematic cross-sectional view showing a ceramic-coated sintered silicon carbide/carbon complex according to the present invention.

FIG. 16 is a schematic cross-sectional view showing a ceramic-coated sintered silicon carbide/carbon complex of an embodiment according to the present invention.

As shown in FIG. 16, a ceramic-coated sintered silicon carbide/carbon complex 24 of this embodiment is constituted by providing a ceramic coating layer 23 on the surface of a sintered silicon carbide/carbon complex 22. Although in this embodiment the ceramic coating layer 23 is provided on the entire surface of the sintered silicon carbide/carbon complex 22, the ceramic coating layer 23 in the present invention is not necessarily provided on the entire surface of the sintered silicon carbide/carbon complex 22 and only has to be provided on at least a portion of the surface thereof. For example, the ceramic coating layer 23 may be provided only on either one of the top, bottom, and side surfaces of the sintered silicon carbide/carbon complex 22.

The ceramic coating layer 23 can be formed from ceramics including oxides, carbides, and nitrides. The ceramic material forming the ceramic coating layer 23 may be silicon carbide or another type of ceramic material. The composition of the ceramic coating layer 23 may change from the inner portion toward the outer portion. In this case, it is also possible that the inner portion of the ceramic coating layer 23 has a composition close to silicon carbide and the rest thereof has gradually changing compositions from the inner portion toward the outer portion.

An example of a method for forming the ceramic coating layer 23 is a method in which a yet-to-be-fired green compact for a sintered silicon carbide/carbon complex 22 is formed, a layer of ceramic powder for forming the ceramic coating layer 23 is provided on at least a portion of the surface of the green compact, and in this state the sintered silicon carbide/carbon complex 22 and the ceramic coating layer 23 are integrally formed by sintering.

In this case, the ceramic coating layer 23 may be formed of a plurality of layers and have different compositions in the direction of the thickness. Thus, the adhesion between the sintered silicon carbide/carbon complex 22 and the ceramic coating layer 23 can be increased to improve properties, such as the strength as a whole.

Furthermore, the ceramic powder used for forming the ceramic coating layer 23 may be a mixture of silicon carbide powder and one or more other types of powder. Thus, the adhesion between the ceramic coat layer 23 and the sintered silicon carbide/carbon complex 22 can be increased to improve properties, such as strength.

An alternative example of the method for forming the ceramic coating layer 23 is a method in which a sintered silicon carbide/carbon complex 22 is produced, a sintered ceramic sheet or a ceramic single crystal sheet is placed on at least a portion of the surface of the sintered complex, and the sintered ceramic sheet or single crystal sheet is joined to the surface of the sintered silicon carbide/carbon complex 22. Specific example of the method for joining include hot press, spark plasma sintering, and welding heating.

Alternatively, the ceramic coating layer 23 can be formed by using the sintered silicon carbide/carbon complex as a substrate and coating the substrate with ceramics by a normal CVD process or a reactive sputtering process.

REFERENCE SIGNS LIST

1 . . . Graphite crucible
2 . . . Carbon sheet
3 . . . SiO powder
4 . . . Layer of carbon felt
5 . . . Graphite particle
6 . . . Layer of carbon felt
7 . . . Carbon sheet
10 . . . Graphite particle
11 . . . Silicon carbide coating
12 . . . Silicon carbide-coated graphite particle
20 . . . Graphite particle
21 . . . Silicon carbide interfacial layer
22 . . . Sintered silicon carbide/carbon complex
23 . . . Ceramic coating layer
24 . . . Ceramic-coated sintered silicon carbide/carbon complex

The invention claimed is:

1. A pressure sintered silicon carbide/carbon complex obtained by pressure sintering carbon base material particles coated with a layer of silicon carbide,
    wherein the relative density of the pressure sintered silicon carbide/carbon complex is 90% to 100% and the total content of Al, Be, B, and Se therein is below 0.1% by weight; and
    wherein a silicon carbide interfacial layer is disposed around the carbon base material particles and provided continuously in the form of a three-dimensional network.

2. The pressure sintered silicon carbide/carbon complex according to claim 1, wherein the carbon base material particles are graphite particles.

3. The pressure sintered silicon carbide/carbon complex according to claim 1, wherein the average particle size of the carbon base material particles is within the range of 50 nm to 500 μm.

4. The pressure sintered silicon carbide/carbon complex according to claim 1, wherein the thickness of the silicon carbide interfacial layer is within the range of 1 nm to 20 μm.

5. A ceramic-coated sintered silicon carbide/carbon complex in which a ceramic coating layer is formed on at least a portion of a surface of the pressure sintered silicon carbide/carbon complex according to claim 1.

6. A process for production of the pressure sintered silicon carbide/carbon complex according to claim 1,
   wherein the pressure sintering is performed at a temperature of 2200° C. or below.

7. The process for production of the pressure sintered silicon carbide-carbon complex according to claim 6, wherein the pressure sintering is performed without the use of any sintering aid.

8. The pressure sintered silicon carbide/carbon complex according to claim 1, wherein the pressure sintering is performed by heat application at about 2000° C. under a pressure of about 40 MPa.

* * * * *